(12) United States Patent
Lin et al.

(10) Patent No.: US 7,454,691 B2
(45) Date of Patent: *Nov. 18, 2008

(54) METHOD AND SYSTEM FOR ENCODING DIGITAL DATA FOR OPTICAL RECORDING SYSTEM

(75) Inventors: Li-Lien Lin, Hsin-Chu (TW); Wen-Yi Wu, Hsin-Chu (TW)

(73) Assignee: MediaTek Inc. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/582,598

(22) Filed: Oct. 17, 2006

(65) Prior Publication Data

US 2007/0061691 A1    Mar. 15, 2007

Related U.S. Application Data

(63) Continuation of application No. 10/409,454, filed on Apr. 9, 2003, now Pat. No. 7,139,962.

(30) Foreign Application Priority Data

Nov. 4, 2002    (TW) ............................... 91132537 A (51) Int. Cl.
*H03M 13/00*    (2006.01)

(52) U.S. Cl. ...................... 714/784; 714/756; 714/762; 714/758; 714/799

(58) Field of Classification Search ................ 714/758, 714/784, 781, 801, 752, 756, 762, 799
See application file for complete search history.

(56) References Cited

U.S. PATENT DOCUMENTS

| 5,793,724 | A | * | 8/1998 | Ichikawa et al. | ......... 369/47.31 |
| 5,901,159 | A | * | 5/1999 | Ichikawa | ..................... 714/765 |
| 6,253,349 | B1 | * | 6/2001 | Maeda et al. | ............... 714/799 |
| 6,470,473 | B1 | | 10/2002 | Iwasa | |
| 6,487,293 | B2 | | 11/2002 | Sako et al. | |
| 6,721,917 | B2 | * | 4/2004 | Shieh | ........................ 714/755 |
| 6,772,386 | B2 | | 8/2004 | Iwata et al. | |
| 6,963,296 | B2 | | 11/2005 | Oki et al. | |
| 6,983,413 | B2 | | 1/2006 | Otake et al. | |
| 7,225,385 | B2 | * | 5/2007 | Lin et al. | ..................... 714/755 |

FOREIGN PATENT DOCUMENTS

CN          1359103 A          7/2002

* cited by examiner

*Primary Examiner*—Esaw Abraham
(74) *Attorney, Agent, or Firm*—Andrew D. Fortney (57) ABSTRACT

The present invention is a method and system for encoding digital data. The encoding system proceeds the step of calculating error detection code and the step of scrambling the main data at the same time to decrease times for the access to the first memory. The present invention comprises a second memory. The encoding system can access more than one recording column per-time, which further decreases times for the access to the first memory.

30 Claims, 9 Drawing Sheets

METHOD AND SYSTEM FOR ENCODING DIGITAL DATA FOR OPTICAL RECORDING SYSTEM

This application is a continuation of application Ser. No. 10/409,454, filed Apr. 9, 2003, now U.S. Pat. No. 7,139,962.

BACKGROUND OF THE INVENTION

1. Field of the Invention

The present invention relates to a method and system of data encoding, and more particularly to a method and system for encoding digital data for an optical recording system.

2. Description of the Prior Art

Figure 1:
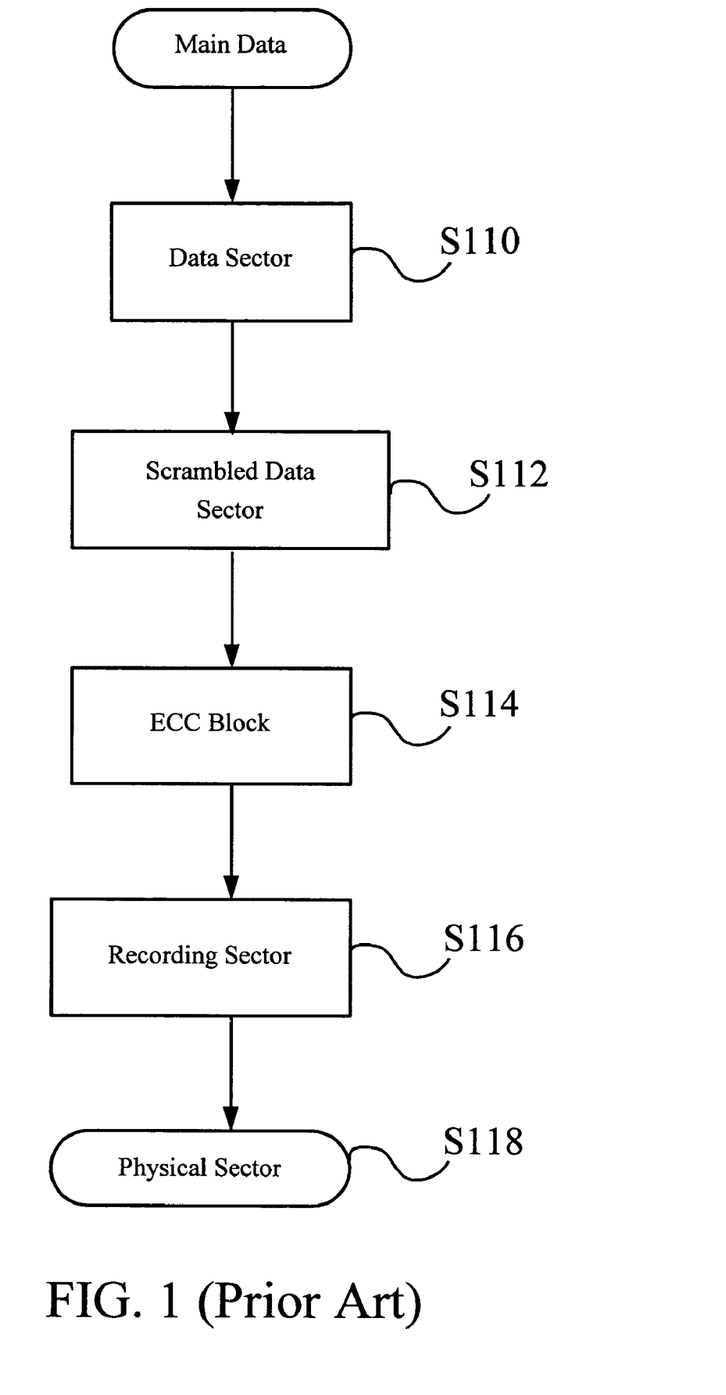
FIG. 1 is a flow chart of the main steps of the DVD data encoding process according to the prior art.

While an optical recording system writes data onto an optical recording medium, the optical recording system needs to proceed a series of encoding process at first so that the data can be written onto the optical recording medium by the optical recording system. Here is an example for the conventional digital versatile disc (DVD). Please refer to FIG. 1. FIG. 1 is a flow chart of the main steps of the DVD data encoding process according to the prior art. Briefly, the conventional DVD data encoding process comprises the following steps:

Step S110: buffering the storage data or so-called the main data into the memory to form a data sector;

Step S112: scrambling the main data to form a scrambled data sector;

Step S114: encoding and buffering the 16 scrambled data sectors into the memory to form an error correcting code block (ECC block);

Step S116: dividing an ECC block into 16 recording sectors;

Step S118: modulating each recording sector by way of eight to fourteen modulation plus to form a physical sector recorded on the DVD.

Figure 2:
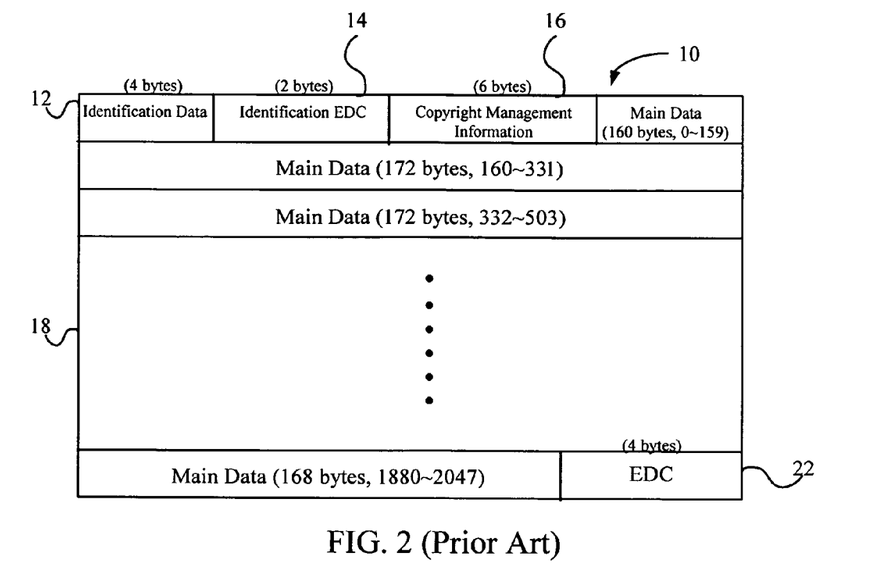
FIG. 2 is a schematic diagram of the data sector according to the prior art.

The followings are illustrations and descriptions for each step shown in FIG. 1. Please refer to FIG. 2. FIG. 2 is a schematic diagram of the data sector 10 according to the prior art. Before written into the DVD, the main data must be buffered into the memory within the DVD recording system, and the format of the main data within the memory is called data sector. The conventional data sector 10 is used for storing an identification data (ID) 12, an identification error detection code (IED) 14, a copyright management information (CPR-MAI) 16, a main data 18, and an error detection code 22 corresponding to the above data. The corresponding locations of the above data arranged within the memory are shown as FIG. 2.

The identification data 12 has four bytes, wherein the first byte comprises the message of the data sector 10, and the other three bytes represent the number of the data sector 10. The identification error detection code 14 has two bytes for detecting the error of the identification data 12. The copyright management information 16 has six bytes as a basis of using the copyright of the data sector 10. After adding up the main data for 2048 bytes and the error detection code 22 for 4 bytes, a data sector 10 has data for 2064 bytes. A data sector which is divided into a 12×172 matrix (12 rows and 172 columns) is arranged in the memory in the prior art.

The steps of buffering the data into the data sector 10 comprise calculating the error detection code in accordance with the identification data 12 to get the identification error detection code 14. After getting the identification error detection code 14, buffer the identification data 12, the identification error detection code 14, the copyright management information 16, and the main data 18 into the corresponding location in the memory as shown in FIG. 2. Then the DVD recording system reads the above data recorded in the memory to calculate the error detection code 22 of the above data. Finally buffer the identification data 12, the identification error detection code 14, the copyright management information 16, and the main data 18 with the error detection code 22 into the memory. Up to this step, the temporary storage of a data sector and the calculating process of the error detection code have been completed.

Figure 3:
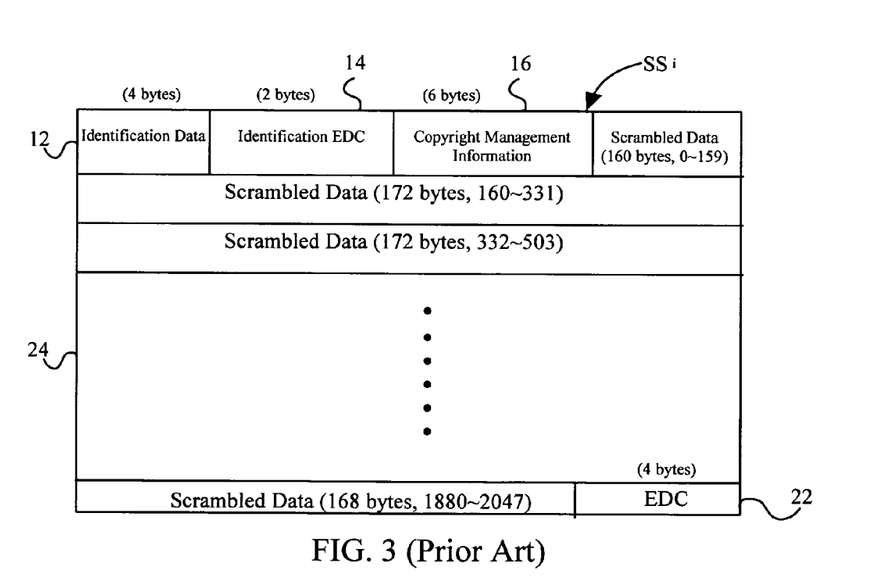
FIG. 3 is a schematic diagram of the scrambled data sector $SS_i$ in the prior art.

Please refer to FIG. 3. FIG. 3 is a schematic diagram of the scrambled data sector $SS_i$ in the prior art. After completing the data sector shown in FIG. 2, DVD reads the main data 18 again from the memory and scrambles the main data to form a scrambled data 24. Then buffer the scrambled data 24 for 2048 bytes into the memory to form a scrambled data sector $SS_i$. Because the scrambled data 24 and the main data 18 are both 2048 bytes, the data arrangement and storage for the scrambled data sector $SS_i$ is the same as that for the data sector 10.

Figure 4:
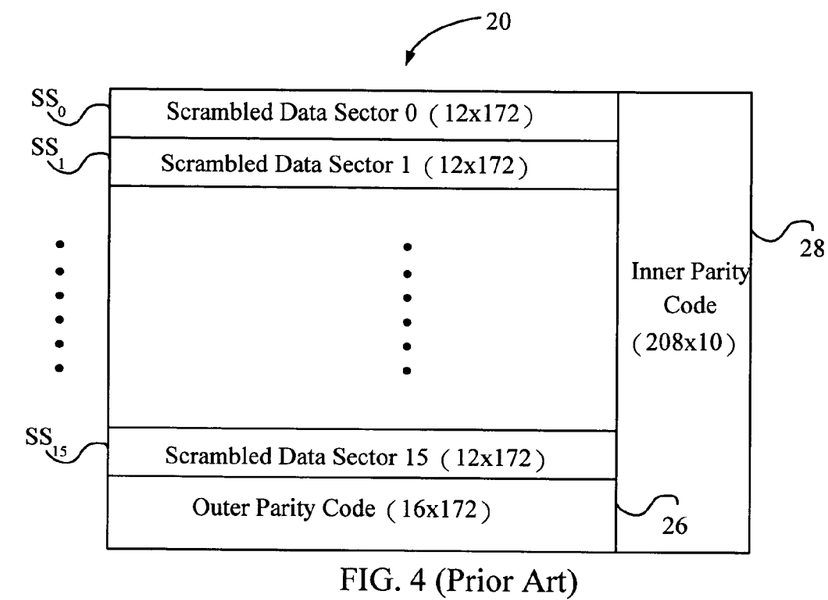
FIG. 4 is a schematic diagram of the ECC block in the prior art.

Please refer to FIG. 4. FIG. 4 is a schematic diagram of the ECC block 20 in the prior art. The process from the main data to the scrambled data sector should be proceeded for 16 times. After finishing the 16 scrambled data sectors $SS_i$(i=0~15), the DVD recording system begins to form an ECC block 20. According to the data arrangement for the scrambled data sector $SS_i$, the 16 scrambled data sectors $SS_i$ should be a 192×172 matrix (192 rows and 172 columns). Then DVD reads the data of 16 scrambled data sectors to calculate an outer parity code 26 and an inner parity code 28.

The calculation for the outer parity code (PO) 26 is to calculate the data of a column within the 16 scrambled data sectors to get an outer parity code for 16 bytes corresponding to the column. After calculating the data of all 172 columns within the 16 scrambled data sectors, the calculating is completed and a whole set of outer parity codes 26 is obtained. Then buffer the outer parity codes 26 behind the last row of the 16 scrambled data sectors. Accordingly, the data arrangement for the outer parity code 26 is a 16×172 matrix (16 rows and 172 columns).

The calculation of the inner parity code (PI) 28 is to calculate the data of the 16 scrambled data sectors and each row within the whole set of outer parity codes 26 gets an inner parity code for 10 bytes corresponding to the row. After calculating the data of all 208 rows, a whole set of inner parity codes 28 is obtained. Accordingly, the data arrangement for the inner parity code 28 is a 208×10 matrix (208 rows and 10 columns).

Figure 5:
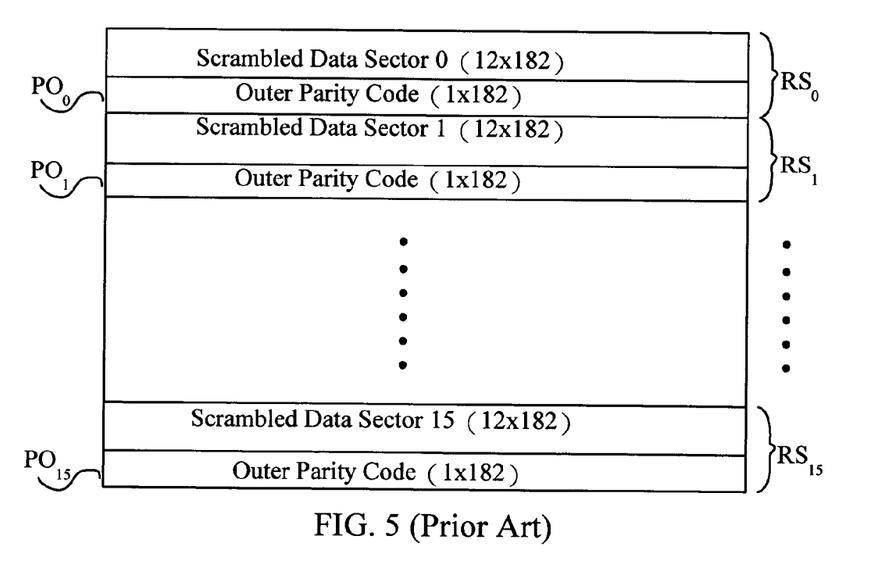
FIG. 5 is a schematic diagram of the 16 recording sectors $RS_i$ in the prior art.

Please refer to FIG. 5. FIG. 5 is a schematic diagram of the 16 recording sectors $RS_i$ in the prior art. After code calculation for the outer parity code 26 and the inner parity code 28, divide the whole set of outer parity codes 26 into 16 rows of the outer parity code $PO_i$ (i=0~15) and interleave each of the rows into each of the 16 scrambled data sectors $SS_i$ (i=0~15) respectively and correspondingly. The interleaved address is the next row of the last data row within each of the scrambled data sectors to further form a data arrangement of 13 rows. At this time, the sector is called the recording sector $RS_i$ (i=0~15).

As shown in FIG. 1, after the above steps, the last step of the DVD data encoding processes is to read the 16 recording sectors $RS_i$(i=0~15) one by one from the memory and further to proceed the eight to fourteen modulation plus (EFM plus) of the data. Therefore, the DVD recording system can record the data stored in the recording sector as a physical sector within the DVD.

Figure 6:
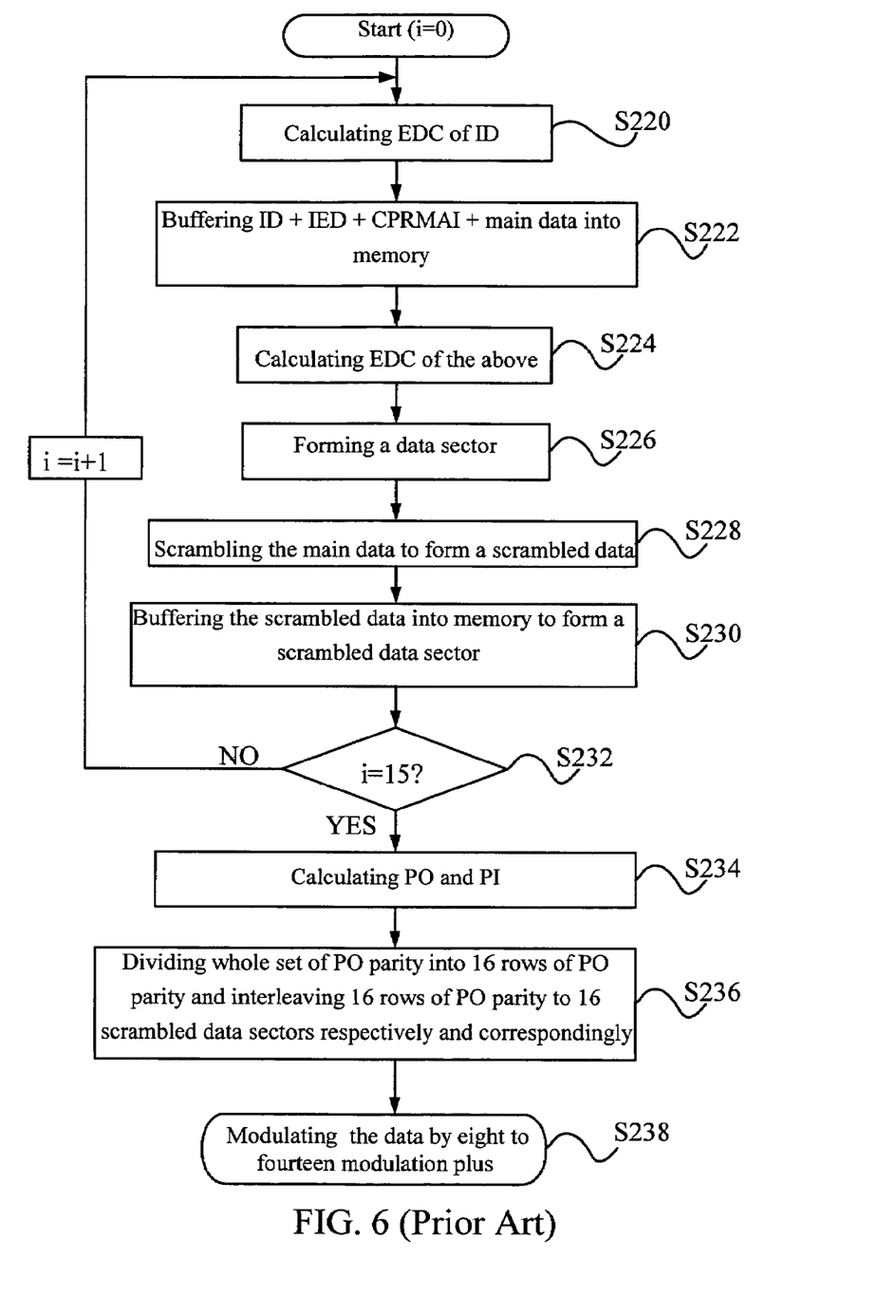
FIG. 6 is a flow chart of a complete DVD data encoding process according to the prior art.

Please refer to FIG. 6. FIG. 6 is a flow chart of a complete DVD data encoding process according to the prior art.

According to the above explanation, the conventional DVD encoding method is structurally conscientious, but involves too many processes. The whole data encoding process is summarized and comprises the following steps:

Step S220: calculating the error detection code of the identification data 12 to form the identification error detection code 14.

Step S222: buffering the identification data 12, the identification error detection code 14, the copyright management information 16, and the main data 18 into the memory.

Step S224: reading the identification data 12, the identification error detection code 14, the copyright management information 16, and the main data 18 recorded in the memory to calculate the error detection code 22 of the above data.

Step S226: buffering the identification data 12, the identification error detection code 14, the copyright management information 16, the main data 18, and the error detection code 22 into the memory to finish temporary storage for a data sector and the calculating process of the error detection code.

Step S228: reading the main data 18 from the memory and scrambling the main data 18 to form a scrambled data 24.

Step S230: buffering the scrambled data 24 for 2048 bytes into the memory to form a scrambled data sector $SS_i$.

Step S232: proceeding the above processes (from steps S220 to S230) repeatedly to form 16 scrambled data sectors $SS_i$ (i=0~15). After forming 16 scrambled data sectors, go to step 34.

Step S234: reading the data of the 16 scrambled data sectors to proceed calculating of the outer parity code 26 and the inner parity code 28.

Step S236: dividing the whole set of outer parity codes 26 into 16 rows of the outer parity code $PO_i$ (i=0~15), and interleaving the rows into the 16 scrambled data sectors $SS_i$ (i=0~15) respectively and correspondingly.

Step S238: reading the 16 recording sectors $RS_i$ (i=0~15) one by one from the memory to proceed the eight to fourteen modulation plus (EFM plus) of the data.

Such complicated steps in the prior art cause a DVD recording system to access memory for many times and increase the requirement for the memory bandwidth. Furthermore, the above step S226 and step S228 are just brief descriptions, and the steps require multiple memory accesses. Hence, it is necessary to provide an improved method to reduce such multiple memory accesses to lower the requirement for the memory bandwidth for the DVD.

SUMMARY OF THE INVENTION

It is therefore a primary objective of the present invention to provide an encoding method to solve the problem of the complicated steps for the conventional technique.

It is an another objective of the present invention to provide an encoding system for reducing the amount of memory access while calculating the code of the ECC block and further to reduce the memory requirement for an optical recording system.

In a preferred embodiment, the present invention provides a system for encoding digital data. The digital data comprises at least one header and at least one sector data. The header represents the main data correspondingly. The encoding system comprises a first memory, a header buffering module, a scrambling module, an error detection code generating module, an outer parity code generating module, and an inner parity code generating module.

The first memory comprises at least one storage block. The storage block comprises a data sector. The data sector comprises a plurality of storage columns and storage rows arranged in matrix for storing data.

The header buffering module is used for buffering the header into the data sector. The scrambling module is used for scrambling the main data to form a corresponding scrambled data, and buffering the scrambled data into the data sector. The error detection code generating module is used for calculating the header and the main data to generate a corresponding error detection code, and buffering the error detection code into the data sector.

The outer parity code generating module is used for reading at least one storage column per time, and calculating the data buffered in the storage column to get an outer parity code. After calculating the data buffered in the plurality of storage columns, get a set of outer parity codes. The inner parity code generating module is used for reading at least one storage row per time, and calculating the data buffered in the storage row to get an inner parity code. After calculating the data buffered in the plurality of storage rows and the set of outer parity codes, get a set of inner parity codes.

Because of reducing the times for memory access when scrambling the main data and calculating the error detection code, the steps of data encoding of the present invention are less than the prior art. Furthermore, the present invention the temporary storage space for the inner parity code within each storage block to buffer the inner parity code into the memory directly without accessing the memory repeatedly. Thus, the present invention saves more memory bandwidths than the prior art.

These and other objects, features and advantages of the present invention will become apparent from the following detailed description of illustrative embodiments thereof, which is to be read in connection with the accompanying drawings.

DETAILED DESCRIPTION OF THE PREFERRED EMBODIMENT

Figure 7:
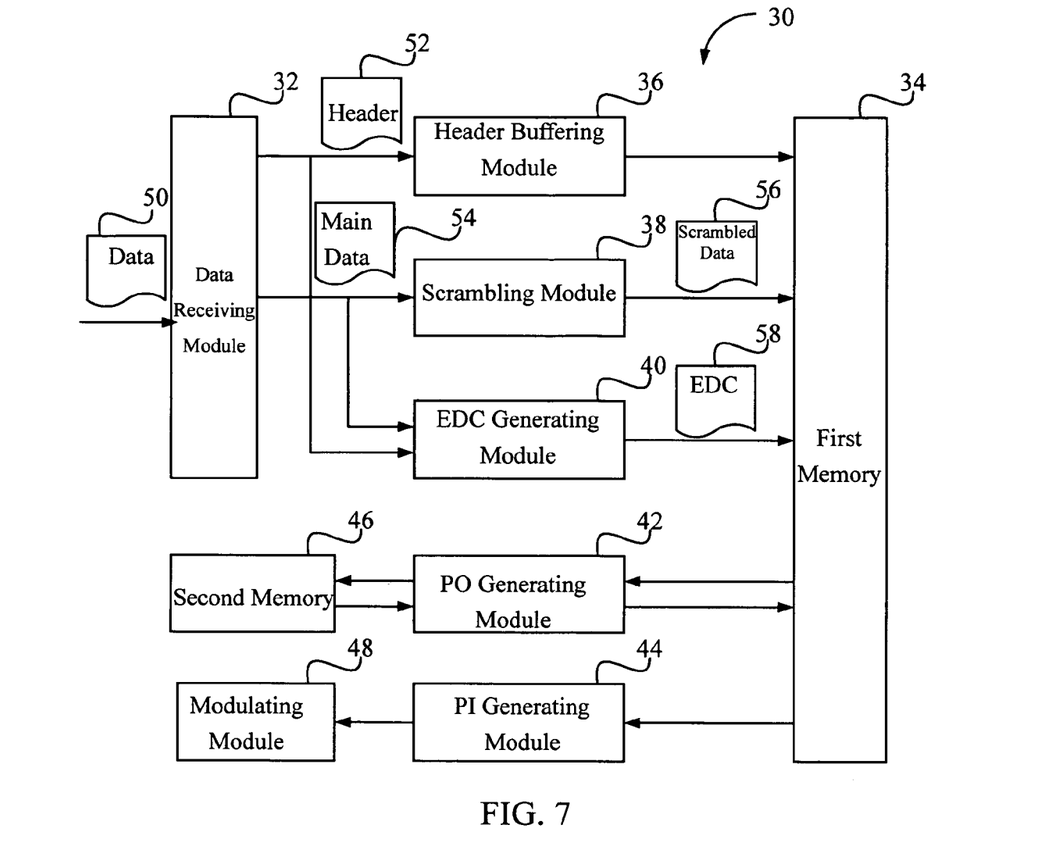
FIG. 7 is a schematic diagram of a data encoding system according to the present invention.
Figure 8:
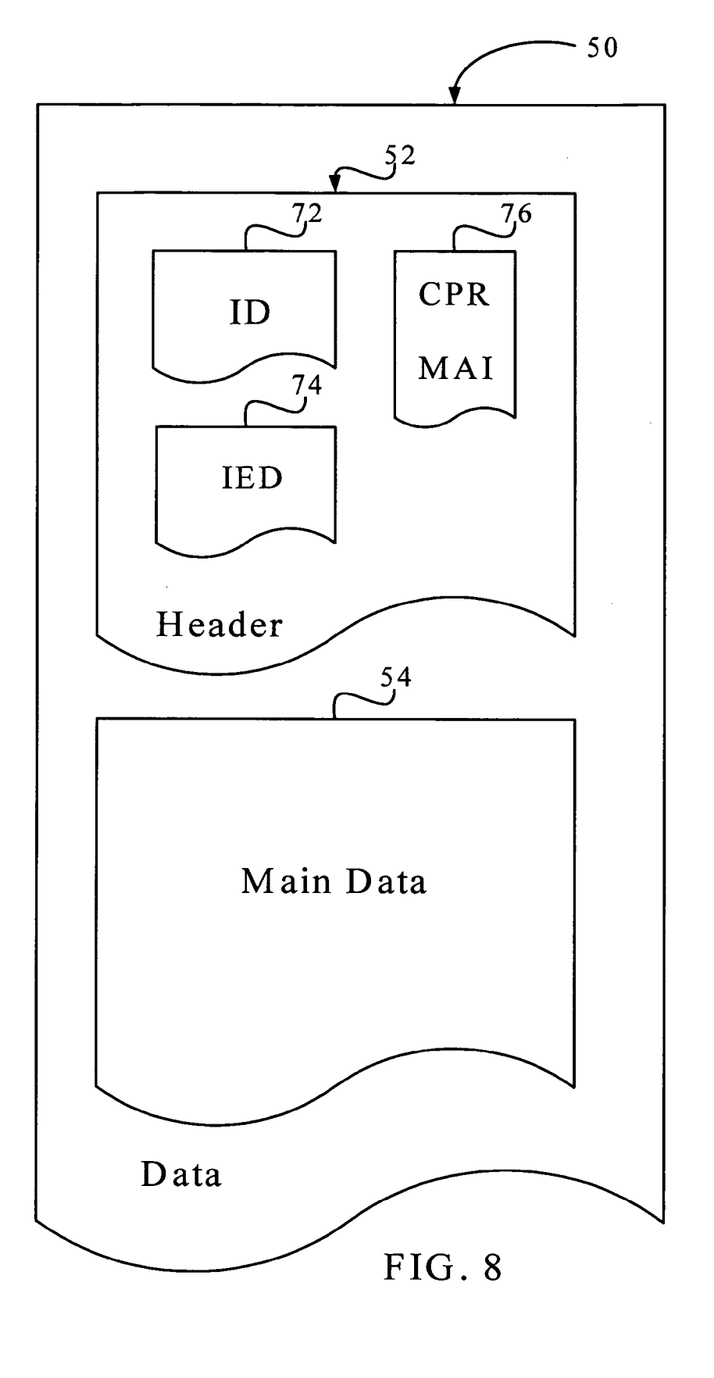
FIG. 8 is a schematic diagram of the digital data shown in FIG. 7.

Please refer to FIG. 7 and FIG. 8. FIG. 7 is a schematic diagram of a data encoding system 30 according to the present invention, and FIG. 8 is a schematic diagram of the digital data 50 shown in FIG. 7. The data encoding system 30 of the present invention is used for encoding digital data 50. The encoding system 30 comprises a data receiving module 32, a first memory 34, a header buffering module 36, a scrambling module 38, an error detection code generating module 40, an outer parity code generating module 42, an inner parity code generating module 44, a second memory 46, and a modulation module 48.

As shown in FIG. 8, the digital data 50 comprises at least one header 52 and at least one main data 54. The header 52 represents the main data 54 correspondingly. In the preferred embodiment of the present invention, the digital data comprises 16 main data and 16 headers correspondingly. For illustrating easily, the following description will just describe the encoding method for one main data and the corresponding header, and the encoding method for other 15 main data and the corresponding headers is the same. In the preferred embodiment of the present invention, the header 52 comprises an identification data 72, an identification error detection code 74, and a copyright management information 76, wherein the identification error detection code 74 is obtained by calculating the identification data 72.

As shown in FIG. 7, the data receiving module 32 is used for receiving the digital data 50 from a computer or any outside or inside data input device, and outputting to other modules of the encoding system 30 to proceed digital data encoding.

Figure 9:
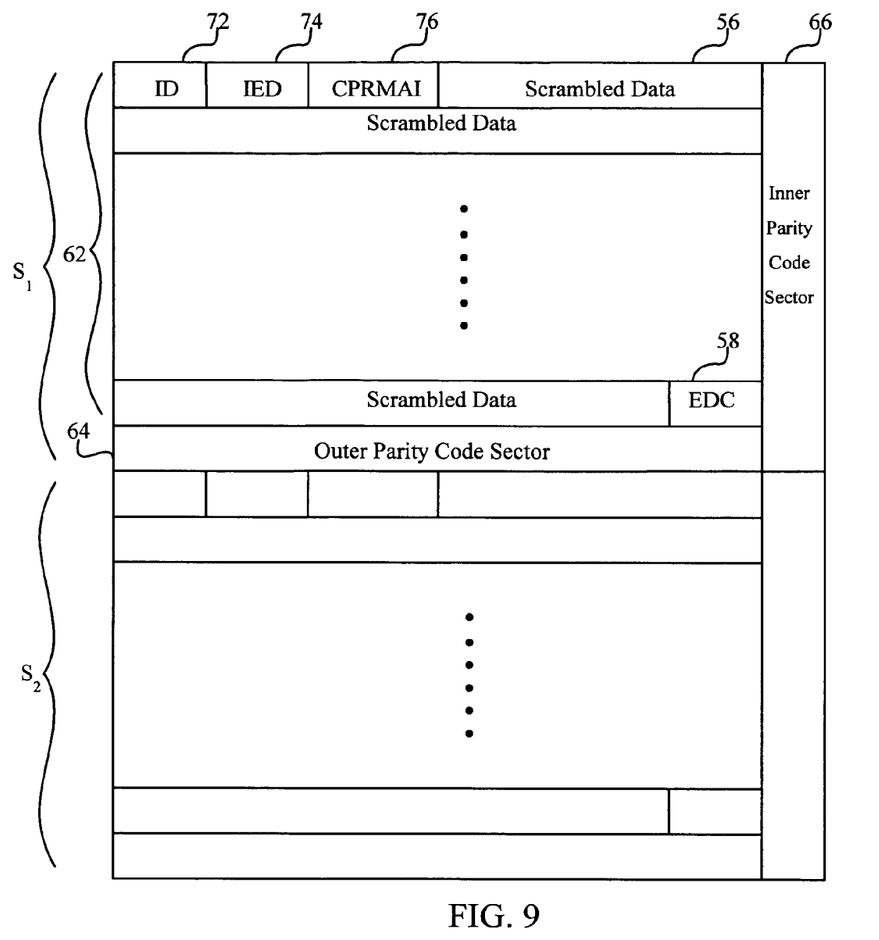
FIG. 9 is a schematic diagram of two storage blocks of the first memory shown in FIG. 7.

Please refer to FIG. 9. FIG. 9 is a schematic diagram of two storage blocks $S_1$ and $S_2$ of the first memory 34 shown in FIG. 7. The first memory 34 is a DRAM, which comprises at least one storage block $S_i$. FIG. 9 shows two storage blocks $S_1$ and $S_2$. Each storage block $S_i$ comprises a data sector 62, an outer parity code sector 64, and an inner parity code sector 66. Each of the data sector 62, the outer parity code sector 64, and the inner parity code sector 66 comprises a plurality of storage columns and storage rows arranged in matrix for storing data. In the preferred embodiment of the present invention, the digital data 50 are buffered into 16 storage blocks $S_i$ (i=0~15) of the first memory 34 respectively. The data sector 62 of each storage block $S_i$ is used for buffering one main data 54 and the data within the corresponding header 52.

Please refer to FIG. 7 and FIG. 9. The header buffering module 36 is used for encoding the identification data 72 to generate the identification error detection code 74, and buffering the header 52 into the data sector 62. The identification data 72, the identification error detection code 74, and the copyright management information 76 of the header 52 are interleaved into the corresponding locations of the data sector 62.

The scrambling module 38 is used for scrambling the main data 54 to form a corresponding scrambled data 56, and buffering the scrambled data 56 into the corresponding location of the data sector 62. The error detection code module 40 is used for calculating the header 52 and the main data 54 to generate a corresponding error detection code 58, and buffering the error detection code 58 into the corresponding location of the data sector 62. The encoding system 30 of the present invention proceeds the steps of scrambling the main data and calculating the error detection code at the same time to reduce the number of times for access to the first memory 34. Therefore, the present invention effectively decreases the memory bandwidth required, comparing with the prior art.

Buffering the error detection code into the data sector also means that the encoding process of a scrambled data sector is completed. Then the system will proceed to encode the outer parity code and the inner parity code to form an ECC block after finishing the encoding process of 16 scrambled data sector.

As shown in FIG. 7, the outer parity code generating module 42 is used for reading at least one storage column per time. The outer parity code generating module 42 reads the data stored in a predetermined amount of storage columns formed by 16 data sectors 62 in the first memory 34. The outer parity code generating module 42 calculates the data buffered in one storage column to generate a corresponding outer parity code, and buffers the residual storage columns into the second memory 46. Then, the outer parity code generating module 42 sequentially reads the data buffered in the second memory 46, and calculates the data to get an outer parity code corresponding to the storage column. After calculating the data buffered in the predetermined amount of storage columns, and the outer parity code generating module 42 gets a set of outer parity codes corresponding to the predetermined amount of storage columns.

In the other embodiment of the present invention, the data encoding system 30 buffers the predetermined amount of storage columns into the second memory 46, and sequentially reads the data buffered in the second memory 46, calculating the data to get a corresponding outer parity code. After calculating the data buffered in the predetermined amount of storage columns, a set of outer parity codes of the storage columns corresponding to the predetermined amount of storage columns.

The outer parity code generating module 42 further buffers the set of outer parity codes into 16 corresponding outer parity code sectors 64 of the first memory 34 after getting the set of outer parity codes. The predetermined amount of storage columns comprises at least two storage columns and no more than all storage columns of the data sector 62.

In the preferred embodiment of the present invention, the second memory 46 is a SRAM. Thus the amount of accessing storage columns at a time of the outer parity code generating module 42 depends on the design of the second memory 46. The second memory 46 may provide enough space for the outer parity code generating module 42 to access all storage columns within the data sector 62 at a time, if the capacity of the second memory 46 is large enough. Otherwise, the second memory 46 at least may provide the outer parity code generating module 42 to access the data of one storage column within the data sector 62 at a time, if the capacity of the second memory 46 is smaller.

As shown in FIG. 7, the inner parity code generating module 44 is used for reading at least one storage row of the data sector 62 per time, and calculating the data buffered in the storage row to get an inner parity code corresponding to the storage column. After calculating the data buffered in the storage rows and the set of outer parity codes, get a set of inner parity codes.

As shown in FIG. 7, the modulation module 48 is used for modulating the data of the inner parity code generating module 44 and the set of inner parity codes by eight-fourteen modulation plus to generate a data for using by an optical recording system.

Figure 10:
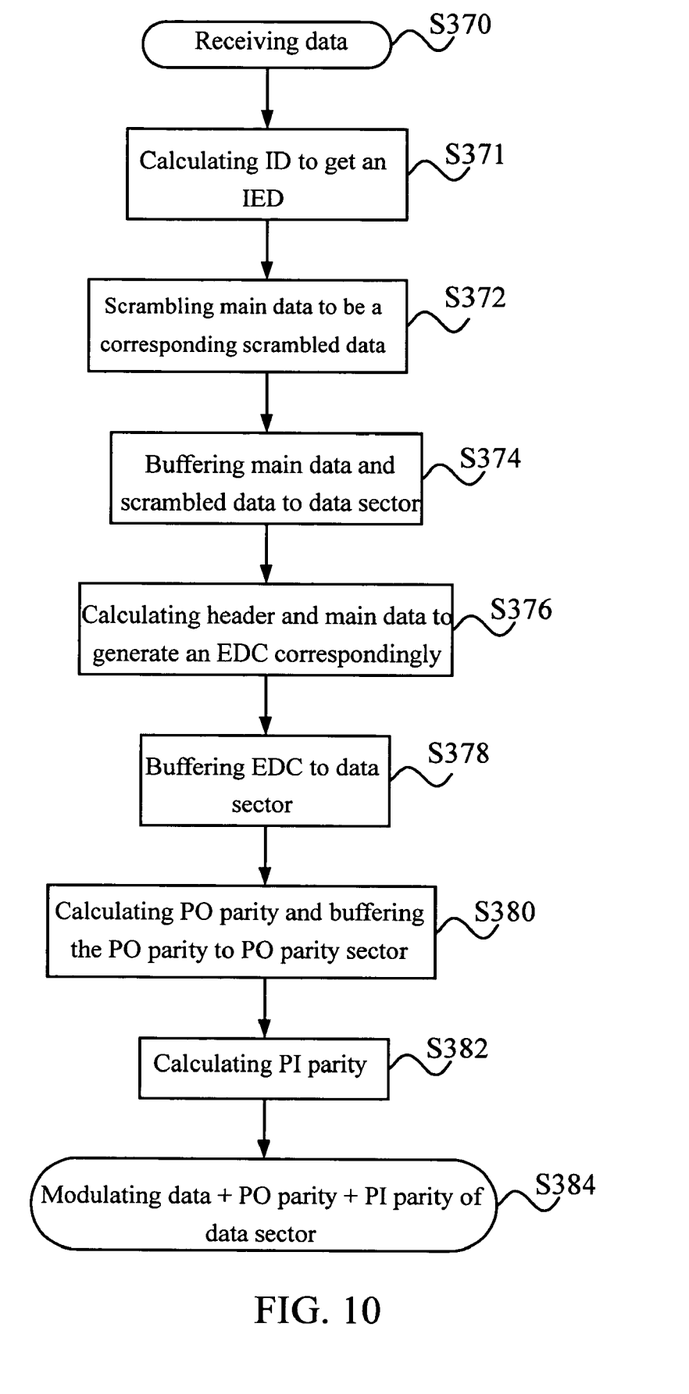
FIG. 10 is a flow chart of the encoding method of the preferred embodiment according to the present invention.

According to the above-mentioned description, the performance of the data encoding system 30 of the present invention can be illustrated as the following steps. Please refer to FIG. 10. FIG. 10 is a flow chart of the encoding method of the preferred embodiment according to the present invention. The encoding method of the present invention comprises the following steps:

Step S370: starting to receive data.

Step S371: encoding identification data to get an identification error detection code.

Step S372: scrambling the main data 54 to be a corresponding scrambled data 56.

Step S374: buffering the main data 52 and the scrambled data 56 into the data sector 62.

Step S376: calculating the header 52 and the main data 54 to generate an error detection code 58 correspondingly.

Step S378: buffering the error detection code 58 into the data sector 62.

Step S380: reading at least one storage column per time, calculating the data buffered in the storage column to get an outer parity code, getting a set of outer parity codes corresponding to the storage columns after calculating the data buffered in the plurality of storage columns, and buffering the set of outer parity codes into the outer parity code sector.

Step S382: reading at least one storage row per time, calculating the data buffered in the storage row to get an inner parity code, getting a set of inner parity codes corresponding to the data sector 62 and the set of outer parity codes after calculating the data buffered in the plurality of storage rows and the set of outer parity codes.

Step S384: modulating the data of the data sector 62, the set of outer parity codes, and the set of inner parity codes by eight to fourteen modulation plus to generate a data for using by an optical recording system.

Figure 11:
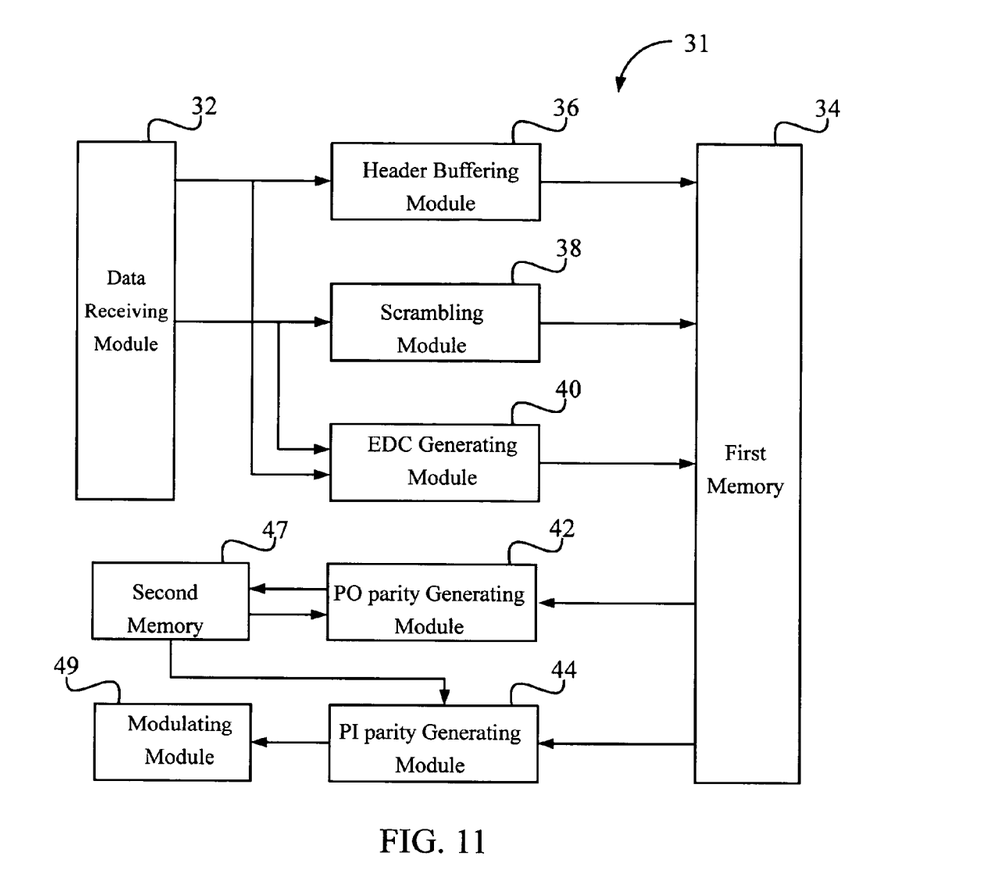
FIG. 11 is a schematic diagram of a data encoding system in another preferred embodiment according to the present invention.

Please refer to FIG. 11. FIG. 11 is a schematic diagram of a data encoding system 31 in another preferred embodiment according to the present invention. The process of the data encoding system 31 in FIG. 11 and the process of the data encoding system 30 in FIG. 7 are the same before executing the outer parity code generating module 42. However, in the data encoding system 31, after the outer parity code generating module 42 generates the set of outer parity codes, the data encoding system 31 buffers the set of outer parity codes into the second memory 47 but not into the first memory 34. Then, the inner parity code generating module 44 reads the data of the data sector from the first memory 34 row by row, and calculates the inner parity code by reading the outer parity code of the row from the second memory 47. The modulation module 49 uses the data read by the inner parity code generating module 44 and the inner parity code generated from the data for data modulation to form a data which can be used by an optical recording system.

According to the above-mentioned description, the advantages of the data encoding system and method of the present invention comprise the followings:
1. The steps of data encoding of the present invention are less than the prior art because of reducing the times for memory access while scrambling the main data and calculating the error detection code.
2. In the present invention, the system keeps the temporary storage space for the inner parity code within each storage block to buffer the inner parity code into the memory directly without accessing the memory repeatedly.
3. In the present invention, the data encoding system comprises a second memory to buffer the data into the second memory while the outer parity code generating module generates the outer parity code, which reduces the access times of the first memory.
4. The present invention saves more memory bandwidths than the prior art.

With the examples and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An encoding system for encoding digital data, the digital data comprising at least one header data and at least one main data, the header data representing to the main data correspondingly, the encoding system comprising:
   a first memory comprising at least one storage block, the storage block comprising a data sector, the digital data is stored in the data sector in a first direction or second direction;
   a data processing unit for buffering the header data into the data sector, scrambling the main data to form a corresponding scrambled data, buffering the scrambled data into the data sector, calculating the header data and the main data to generate a corresponding error detection code, and buffering the error detection code into the data sector;
   an outer parity code generating module for calculating the main data stored in the first direction from the data sector of the first memory to generate a set of outer parity codes; and
   an inner parity code generating module for calculating the main data stored in the second direction from the data sector of the first memory to generate a set of inner parity codes.

2. The encoding system of claim 1, wherein the first direction represents a storage column of the data sector, and the second direction represents a storage row of the data sector.

3. The encoding system of claim 1, wherein the first direction represents a storage row of the data sector, and the second direction represents a storage column of the data sector.

4. The encoding system of claim 1, wherein the data processing unit comprises:
   a header buffering module for buffering the header data into the data sector;
   a scrambling module for scrambling the main data to form the corresponding scrambled data, and buffering the scrambled data into the data sector; and
   an error detection code generating module for calculating the header data and the main data to generate the corresponding error detection code, and buffering the error detection code into the data sector.

5. The encoding system of claim 4, wherein the scrambling module generating the scrambled data and the error detection generating module generating the error detection code proceed at the same time.

6. The encoding system of claim 1, wherein the header data comprises an identification data, an identification error detection code, and copyright management information.

7. The encoding system of claim 1, further comprising a second memory.

8. The encoding system of claim 7, wherein the outer parity code generating module buffers a predetermined amount of data stored in the data sector in the first direction into the second memory after reading the predetermined amount of data, and then sequentially calculating the predetermined amount of data buffered in the second memory in the first direction to generate a predetermined amount of outer parity codes correspondingly.

9. The encoding system of claim 7, wherein the outer parity code generating module, after reading a predetermined amount of data stored in the data sector in the first direction, calculates parts of the predetermined amount of data buffered in the first direction to generate an outer parity code correspondingly, buffers a residual amount of data buffered in the first direction within the predetermined amount of data to the second memory, and then sequentially calculates the residual amount of data buffered in the first direction within the predetermined amount of data in the second memory to generate a predetermined amount of outer parity codes correspondingly.

10. The encoding system of claim 7, wherein the outer parity code generating device, after reading a plurality of data stored in the data sector in the first direction at a time, buffers the plurality of data stored in the first direction into the second memory at first, and then sequentially calculates the plurality of data buffered in the first direction in the second memory to get the set of outer parity codes correspondingly.

11. The encoding system of claim 7, wherein the outer parity code generating device reads a plurality of data stored in the data sector in the first direction at a time, and calculates the plurality of data buffered in the first direction to generate the set of outer parity codes correspondingly at the same time.

12. The encoding system of claim 7, wherein the outer parity code generating module buffers the set of outer parity codes into the second memory.

13. The encoding system of claim 12, wherein the inner parity code module reads the set of outer parity codes from the second memory to generate a corresponding inner parity code.

14. The encoding system of claim 1, wherein the first memory further comprises an outer parity code sector and an inner parity code sector.

15. The encoding system of claim 14, wherein the outer parity code generating module buffers the set of outer parity codes into the outer parity code sector.

16. The encoding system of claim 14, wherein the inner parity code generating module buffers the set of inner parity codes into the inner parity code sector.

17. An encoding method for encoding a digital data, the digital data comprising at least one header data and at least one main data, and the header data representing the main data correspondingly, the encoding method comprising the steps of:
setting a first memory comprising at least one storage block thereof, the storage block comprising a data sector, the digital data stored in the data sector in a first or second direction;
buffering the header data into the data sector;
scrambling the main data to form a corresponding scrambled data, and buffering the scrambled data into the data sector;
calculating the header data and the main data to generate an error detection code correspondingly, and buffering the error detection code into the data sector;
calculating the main data stored in the first direction from the data sector of the first memory to generate a set of outer parity codes; and
calculating the main data stored in the second direction from the data sector of the first memory to generate a set of inner parity codes.

18. The encoding method of claim 17, wherein the first direction represents a storage column of the data sector, and the second direction represents a storage row of the data sector.

19. The encoding method of claim 17, wherein the first direction represents a storage row of the data sector, and the second direction represents a storage column of the data sector.

20. The encoding method of claim 17, wherein the step of scrambling the main data and the step of generating the error detection code are proceeded at the same time.

21. The encoding method of claim 17, wherein the header data comprises an identification data, an identification error detection code, and copyright management information.

22. The encoding method of claim 17, further comprising the step of setting a second memory.

23. The encoding method of claim 22, further comprising the following steps of:
buffering a predetermined amount of data in the first direction into the second memory after reading the predetermined amount of data per time; and
sequentially calculating the predetermined amount of data in the first direction in the second memory to get a predetermined amount of outer parity codes correspondingly.

24. The encoding method of claim 22, further comprising the following steps of:
reading a predetermined amount of data in the first direction;
calculating parts of the predetermined amount of data in the first direction to generate an outer parity code correspondingly;
buffering a residual amount of data in the first direction within the predetermined amount of data into the second memory; and
sequentially calculating the residual amount of data buffered in the first direction in the second memory to generate a predetermined amount of outer parity codes correspondingly.

25. The encoding method of claim 22, further comprising the following steps of:
reading a plurality of data in the first direction at a time;
buffering the plurality of data in the first direction into the second memory; and
sequentially calculating the plurality of data buffered in the first direction in the second memory to get the set of outer parity codes correspondingly.

26. The encoding method of claim 22, further comprising the following steps of:
reading a plurality of data in the first direction at a time, and calculating the plurality of data buffered in the first direction at the same time to generate the set of outer parity codes correspondingly.

27. The encoding method of claim 22, further comprising the following step of:
buffering the set of outer parity codes into the second memory.

28. The encoding method of claim 27, further comprising the following step of:
reading and calculating the set of outer parity codes from the second memory to generate an inner parity code correspondingly.

29. The encoding method of claim 17, wherein the first memory further comprising an outer parity code sector and an inner parity code sector.

30. The encoding method of claim 29, further comprising the following step of:
buffering the set of outer parity codes into the outer parity code sector; and
buffering the set of inner parity codes into the inner parity code sector.

* * * * *